(12) United States Patent
Ouchi

(10) Patent No.: US 6,774,982 B2
(45) Date of Patent: Aug. 10, 2004

(54) EXPOSURE APPARATUS AND DEVICE MANUFACTURING METHOD USING THE SAME

(75) Inventor: Chidane Ouchi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/986,323

(22) Filed: Nov. 8, 2001

(65) Prior Publication Data

US 2002/0101892 A1 Aug. 1, 2002

(30) Foreign Application Priority Data

Nov. 10, 2000 (JP) ........................................ 2000-344356

(51) Int. Cl.[7] .......................... G03B 27/54; G03B 27/52
(52) U.S. Cl. ............................................ 355/67; 355/55
(58) Field of Search ................................ 355/52, 55, 67, 355/53

(56) References Cited

U.S. PATENT DOCUMENTS

| | | | | |
|---|---|---|---|---|
| 4,875,076 A | * | 10/1989 | Torigoe et al. | ............... 355/53 |
| 5,150,173 A | * | 9/1992 | Isobe et al. | ................. 356/401 |
| 5,552,892 A | * | 9/1996 | Nagayama | .................. 356/401 |
| 5,789,734 A | * | 8/1998 | Torigoe et al. | .......... 250/201.2 |
| 5,805,273 A | | 9/1998 | Unno | |
| 5,898,501 A | | 4/1999 | Suzuki et al. | |
| 6,256,087 B1 | * | 7/2001 | Bader | .......................... 355/67 |
| 6,278,514 B1 | * | 8/2001 | Ohsaki | ........................ 355/55 |
| 6,331,994 B1 | | 12/2001 | Ohmi et al. | .................. 372/82 |
| 6,603,786 B1 | | 8/2003 | Ohmi et al. | .................. 372/57 |
| 2003/0128346 A1 | | 7/2003 | Murakami et al. | |

FOREIGN PATENT DOCUMENTS

| | | |
|---|---|---|
| EP | 0 820 132 A2 | 1/1998 |
| JP | 7-58393 | 3/1995 |
| JP | 10-163547 | 6/1998 |
| JP | 2000-277411 | 10/2000 |
| JP | 2000-277412 | 10/2000 |

* cited by examiner

Primary Examiner—Russell Adams
Assistant Examiner—D. Ben Esplin
(74) Attorney, Agent, or Firm—Fitzpatrick, Cella, Harper & Scinto

(57) ABSTRACT

An exposure apparatus includes an illumination optical system for illuminating a pattern of a reticle with laser light outputted from a continuous emission laser, a projection optical system for projecting the illuminated pattern onto a subject to be exposed, and an interferometer, of a Fizeau type, being operable while using laser light outputted from the continuous emission laser.

13 Claims, 10 Drawing Sheets

EXPOSURE APPARATUS AND DEVICE MANUFACTURING METHOD USING THE SAME

FIELD OF THE INVENTION AND RELATED ART

This invention relates an exposure apparatus and a device manufacturing method using the same. More particularly, the invention concerns an exposure apparatus and a device manufacturing method in which a projection exposure step is carried out by using laser light outputted from a continuous emission excimer laser.

For measurement of wavefront aberration of a projection optical system, an interferometer may be incorporated into a projection exposure apparatus. However, if such a light source for such an interferometer is provided separately from a light source for the exposure process, it would lead to bulkiness of the exposure apparatus as a whole.

SUMMARY OF THE INVENTION

It is accordingly an object of the present invention to avoid bulkiness of an exposure apparatus which otherwise might result from introduction of an interferometer into the exposure apparatus.

In accordance with an aspect of the present invention, there is provided an exposure apparatus, comprising an illumination optical system for illuminating a pattern of a reticle with laser light outputted from a continuous emission laser; a projection optical system for projecting the illuminated pattern onto a subject to be exposed; and an interferometer operable while using laser light outputted from said continuous emission laser.

In accordance with another aspect of the present invention, there is provided a device manufacturing method, comprising the steps of exposing a wafer to a pattern by use of an exposure apparatus as recited above, and developing the exposed wafer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Figure 1:
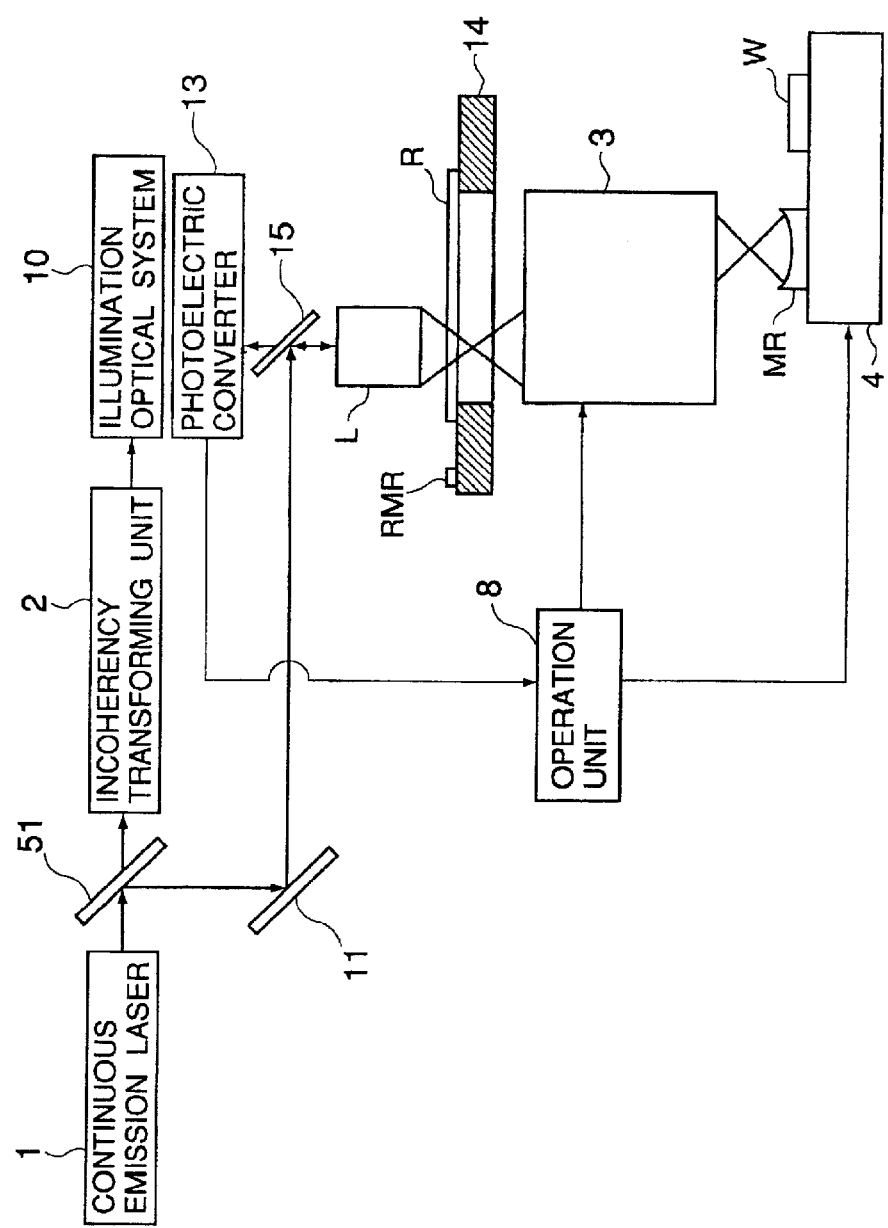
FIG. 1 is a schematic view of a projection exposure apparatus according to a first embodiment of the present invention.

FIG. 1 is a schematic view of a projection exposure apparatus according to a first embodiment of the present invention. The projection exposure apparatus of this embodiment is usable for the manufacture of various devices such as, for example, semiconductor devices, liquid crystal devices, image pickup devices and magnetic heads. Also, this projection exposure apparatus can be applied to a step-and-repeat type or step-and-scan type projection exposure apparatus having a resolution not greater than 0.13 micron, for example.

In FIG. 1, a continuous emission laser 1 may be an excimer laser, for example, for producing laser light having a center wavelength of 193 nm and a half bandwidth not greater than 0.1 pm. Most of the laser light emitted from the continuous emission laser 1 passes through a semi-transmission mirror (beam splitter) 51, and it is transformed into incoherent light by means of an incoherency transforming unit for an illumination optical system. Thereafter, the laser light enters the illumination optical system 10. Then, by means of this illumination optical system 10, the laser light is transformed into illumination light having a predetermined sectional shape and having a uniform light intensity distribution, which in turn illuminates a reticle R.

A projection optical system 3 serves to project a circuit pattern of the reticle as illuminated with the laser light, onto a wafer W in a reduced scale, by which the wafer W is exposed. The wafer W has a plurality of shot regions defined thereon. The projection exposure process such as described above is performed in relation to each shot region on the wafer W, in accordance with single-shot exposure or scan exposure.

The wafer W is held on a movable stage 4, and it can be moved along an image plane of the projection optical system 3 and also along the optical axis direction of the projection optical system 3. Fixedly mounted on this movable stage 4 is an aberration-free reflection member MR which comprises a spherical mirror of concave shape. This reflection member MR is a component of an interferometer.

The exposure apparatus has an aberration-free optical system L (including an objective lens, for example), which is another component of the interferometer. For measurement of the wavefront aberration of the projection optical system 3, the aberration-free optical system L is inserted, by means of a driving mechanism (not shown), between a reticle stage 14 for holding the reticle R and a condenser lens of the illumination optical system 10. For exposure of the wafer W, which is the subject to be exposed, on the other hand, the aberration-free optical system L is retracted therefrom. The wavefront aberration of the projection optical system 3 is measured before a reticle R is placed on the stage 14 or, alternatively, after the reticle R is retracted from between the illumination optical system 10 and the projection optical system 3, with the movement of the reticle stage 14. A portion of the laser light reflected by the semi-transmission mirror 51 is reflected by another mirror 11, which constitutes a relay optical system, and additionally, the light is reflected by another semi-transmission mirror 15 and it enters the aberration-free optical system L. The aberration-free optical system L serves to form a light spot (which functions as an object point for the measurement) at an arbitrary object height position (image height position) of the projection optical system 3. Also, after this, the optical system L focuses the laser light from the spot so that it can enter the projection optical system 3.

For measurement of the wavefront aberration of the projection optical system 3, the aberration-free optical system L is inserted between the reticle stage 14 and the illumination optical system 10, as described above. In addition to this, the movable stage 4 is actuated so that the curvature center of the reflection member MR fixed to the wafer stage 4 coincides with the image height position corresponding to the above-described object height position. Here, the aberration-free optical system L, the projection optical system 3 and the reflection member MR constitute an interferometer.

The laser light outputted from the continuous emission excimer laser which functions as a light source both for the exposure and for the measurement, goes through the aberration-free optical system L and the projection optical system 3, and it impinges on the reflection member MR. The laser light is reflected by the reflection member MR, and again it passes through the projection optical system 3. The laser light passing through the projection optical system 3 interferes with reference light which is provided separately by laser light outputted from the continuous emission laser 1, whereby an interference fringe (interference pattern) is produced. This interference fringe reflects the wavefront aberration of the projection optical system 3.

The thus produced interference fringe is imaged by means of an imaging lens (not shown), upon a photoelectric converter 13. The photoelectric converter 13 converts it into a video signal which, in turn, is applied to an operation unit 8. The operation unit 8 analyzes the video signal, whereby spherical aberration data, which represents the wavefront aberration of the projection optical system 3, is produced. Also, the operation unit 8 may operate to evaluate the state of the projection optical system 3, on the basis of the thus obtained wavefront aberration data. Further, on the basis of the result of the evaluation, the operation unit may perform optimization of the optical performance of the projection optical system 3 automatically, by using an aberration adjusting mechanism of a known type (e.g., a mechanism for moving one or plural lens elements in the optical axis direction), or it may move the wafer stage 4 in the optical axis direction. Alternatively, the operation unit may prohibit the exposure operation.

As regards the interferometer to be provided by the aberration-free optical system L, the projection optical system 3 and the reflection member MR, those well known in the art, that is, a Fizeau type, a Twyman-Green type, and a Mach-Zehnder type, for example, are preferable. The structure of the aberration-free optical system L may be determined in accordance with the type of interferometer to be used. Fizeau type interferometers are particularly preferably because they are simple in structure. Since continuous emission lasers have a long coherence length, an interference fringe of high contrast can be produced even by a Fizeau type interferometer.

Continuous emission excimer lasers have a tendency that the emission wavelength changes with time. In consideration of this, when a continuous emission excimer laser is used as the continuous emission laser 1, for accurate measurement of the interference fringe, that is, the wavefront aberration, preferably, a wavelength stabilization mechanism to be described later may be provided to stabilize the emission wavelength of the continuous emission laser 1.

The projection optical system 3 may comprise either a dioptric system constituted by a lens system, or a catadioptric system constituted by a combination of plural lenses and a concave mirror. When the half bandwidth is small, as in a dioptric system, a lens system being made of a single glass material can be used.

Figure 2:
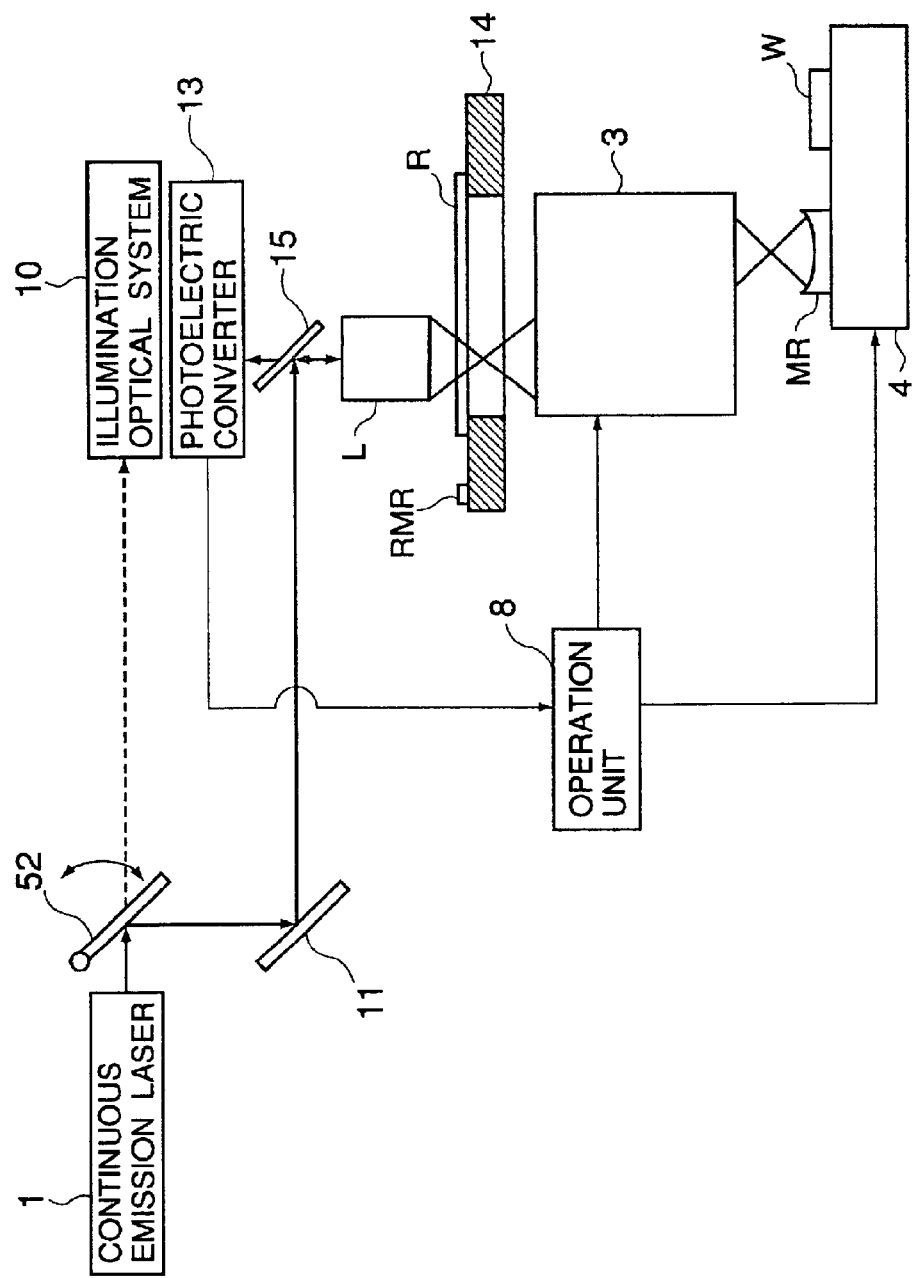
FIG. 2 is a schematic view of a projection exposure apparatus according to a second embodiment of the present invention.

FIG. 2 is a schematic view of a projection exposure apparatus according to a second embodiment, which corresponds to a modified form of the projection exposure apparatus of the first embodiment. Unless mentioned specifically, it has similar features as those of the first embodiment shown in FIG. 1. The first embodiment shown in FIG. 1 uses a semi-transmission mirror 51 to direct a portion of the laser light, outputted from the continuous emission laser 1, toward the aberration-free optical system L. On the other hand, in the second embodiment shown in FIG. 2, there is a light path switching mirror 52, which is disposed between the continuous emission laser 1 and the exposure illumination optical system 10. For measurement of the wavefront aberration of the projection optical system 3, by means of the light path switching mirror 52, the laser light outputted from the continuous emission laser 1 is directed to the aberration-free optical system L. Further, while the first embodiment uses an incoherency transforming element, the second embodiment does not use such an element. However, also in the second embodiment, as in the first embodiment, an incoherency transforming element may be provided between the light path switching mirror 52 and the illumination optical system 10.

Figure 3:
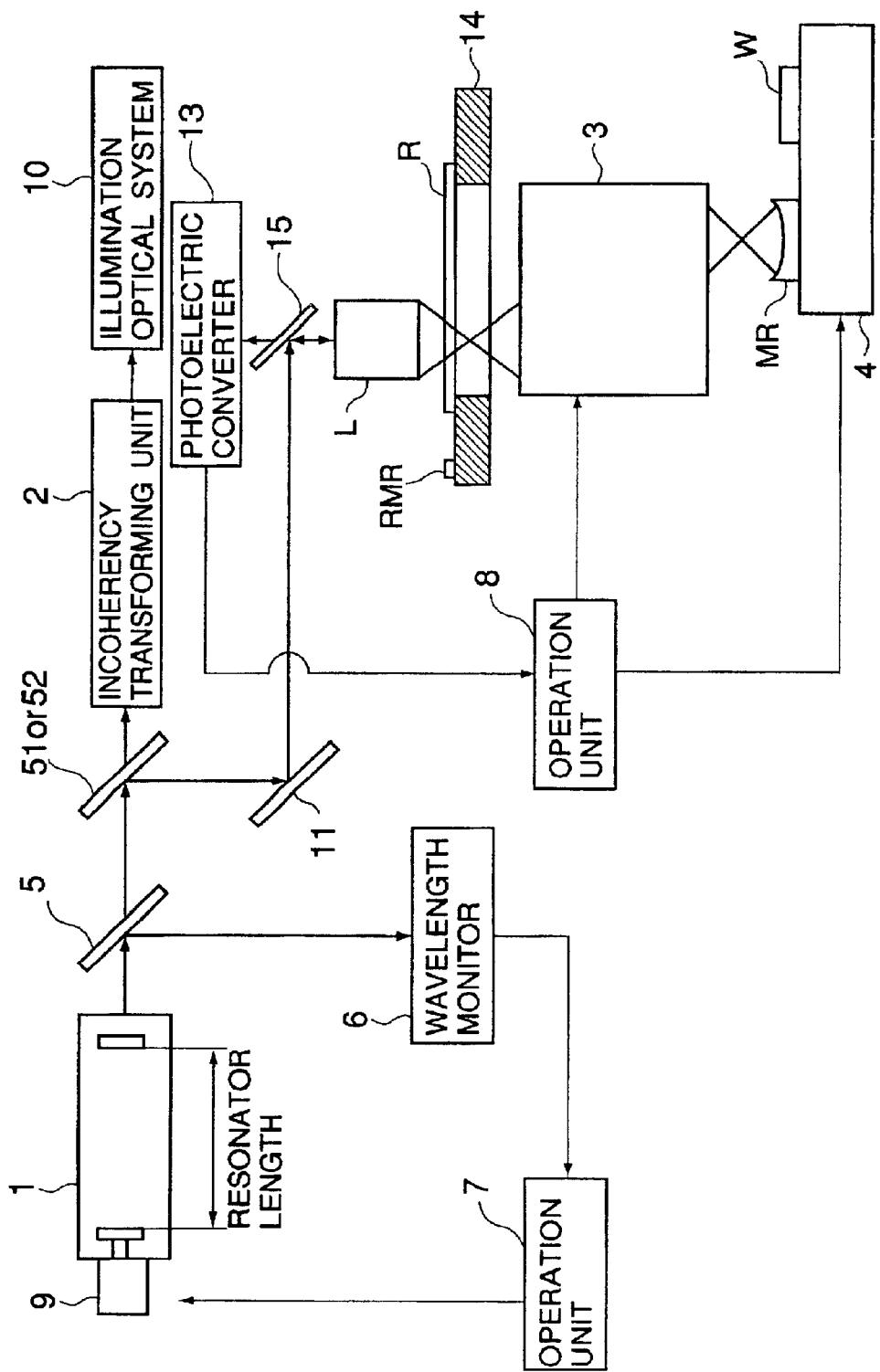
FIG. 3 is a schematic view of a projection exposure apparatus according to a third embodiment of the present invention.

FIG. 3 is a schematic view of a projection exposure apparatus according to a third embodiment of the present invention. The projection exposure apparatus of this embodiment is usable for the manufacture of various devices such as, for example, semiconductor devices, liquid crystal devices, image pickup devices and magnetic heads. This projection exposure apparatus concerns a step-and-scan type exposure apparatus having a resolution not greater than 0.13 micron, for example. Unless mentioned specifically, it has similar features as those of the first embodiment shown in FIG. 1.

Also, in the third embodiment shown in FIG. 3, as in the first embodiment, there are an aberration-free optical system L, a projection optical system 3 and a reflection member MR, which constitute an interferometer. By means of this interferometer, the wavefront aberration of the projection optical system 3 is measured, and adjustment of the same is performed. The beam splitter 51 may be replaced by a switching mirror 52 such as shown in FIG. 2.

Denoted in FIG. 3 at 1 is a continuous emission ArF excimer laser having a center wavelength of 193 nm and a half bandwidth not greater than 0.2 pm, preferably, not greater than 0.1 pm. Denoted at 10 is an illumination optical system for illuminating a reticle R, having a circuit pattern formed thereon, with laser light outputted from the laser 1. Denoted at 3 is a projection optical system for projecting an image of the circuit pattern of the reticle R, onto a wafer W in a reduced scale. This projection optical system is provided by a lens system being made of a substantially single glass material. Denoted at 4 is a wafer stage, which is movable while holding a wafer W thereon. Fixedly mounted on this wafer stage 4 is a reflection member MR having a spherical mirror.

In the projection exposure apparatus shown in FIG. 3, while the reticle is illuminated with slit-like illumination light having a rectangular or an arcuate sectional shape, the reticle R and the wafer W are moved along the widthwise direction of the slit-like illumination light, and mutually in opposite directions. In this manner, the circuit pattern of the reticle R is projected and printed on each shot region of the wafer W. The reticle R and the wafer W are moved at a speed ratio corresponding to the projection magnification of the projection optical system 3.

Denoted in FIG. 3 at 5 is a semi-transmission mirror, and denoted at 6 is a wavelength monitor. The wavelength monitor 6 receives a portion of the laser light, reflected by the semi-transmission mirror 5, to detect the wavelength of the laser light. Denoted at 7 is an operation unit, which is operable in response to an output of the wavelength monitor 6, to detect any deviation of the current center wavelength with respect to the design wavelength. Also, the operation unit 7 is operable to actuate a piezoelectric device 9 on the basis of the detected deviation amount. By means of the operation unit 7 and the piezoelectric device 9, a mirror for resonance of the continuous emission laser 1 can be minutely oscillated in the optical axis direction to change the resonator length, by which the emission wavelength of the continuous emission laser 1 can be controlled to the design wavelength. As a result, the emission wavelength of the laser light can be maintained constant. Here, the resonator length refers to the optical path length between a pair of mirrors provided in the laser light source. With this arrangement, in the projection optical system 3, which is a lens system being made of a substantially single glass material, any variation in optical characteristics such as magnification, focal point position and aberration, for example, due to changes in wavelength of the laser light can be avoided. Therefore, a circuit pattern of a reticle R can be projected onto a wafer W very accurately.

In this embodiment, a mirror for the resonator is shifted in the optical axis direction thereby to change the resonator length. However, the resonator length may be changed by changing the pressure of a gas for excitation.

Another operation unit 8 serves to evaluate a video signal supplied from a photoelectric converter 13 or any other information supplied from other sensors, and also to correct any change in optical characteristic of the projection optical system such as magnification, focal point position and aberration, for example, on the basis of the result of the evaluation. The optical characteristic correction may be carried out, for example, by moving one or more lens elements of the projection optical system 3 or moving the movable stage 4 in the optical axis direction. Alternatively, it may be done in accordance with a method known in the art.

Figure 4:
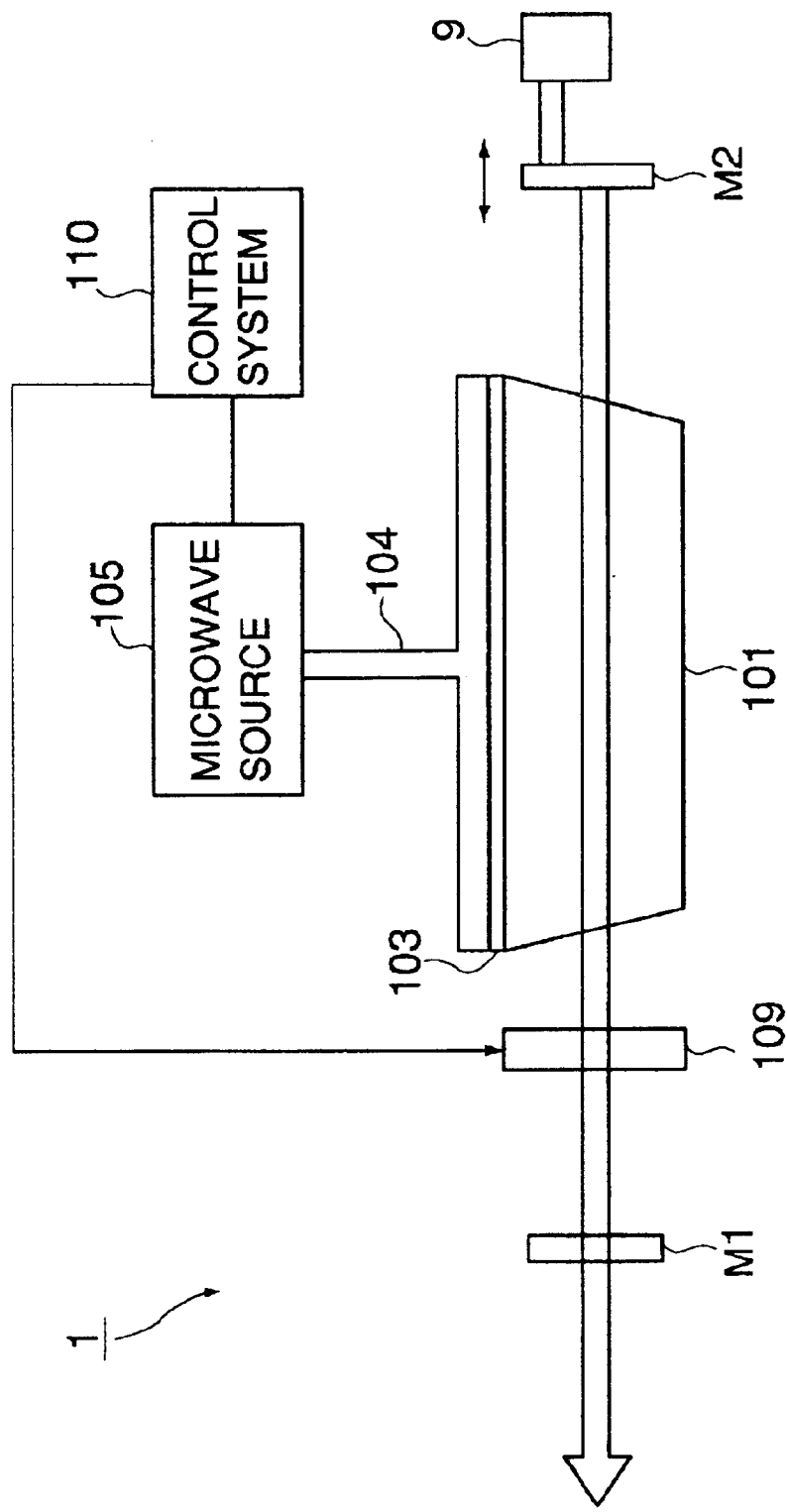
FIG. 4 is a schematic view of a continuous emission excimer laser shown in FIG. 3.

FIG. 4 is a schematic view of the continuous emission excimer laser 1 shown in FIG. 3. Denoted at 101 is a laser chamber in which a gas for excitation is circulated at a high speed. Denoted at 103 is a dielectric member for introducing microwaves into the laser chamber 101. Denoted at 104 is a slot waveguide tube for guiding the microwaves, and denoted at 105 is a microwave emission source for supplying microwaves. Denoted at 109 is a shutter, and denoted at 110 is a control system for controlling the microwave emission source 105 and the shutter 109. Denoted at M1 is an output mirror for outputting light from the laser, and denoted at M2 is another mirror. The mirrors M1 and M2 constitute an optical resonator for the excimer laser 1. Here, the resonator length corresponds to the optical path length between the mirrors M1 and M2.

In operation, microwaves generated by the microwave emission source 105 are guided by the microwave guide 104 and, through the microwave guide 104 and the dielectric member 103, the microwaves are introduced into the laser chamber 101 and they continuously excite the excimer laser gas therein. Light produced from the thus excited excimer laser gas is reflected by the mirror M2 back to the laser chamber 101, and thus it promotes induced emission of light from the excited excimer laser gas. The thus produced light advances reciprocally inside the optical resonator, including the output mirror M1 and the mirror M2, and it promotes successive induced emissions of light. As a result of this, only light of a predetermined wavelength is amplified. Then, a portion of the thus amplified light is outputted via the mirror M1.

Figure 5:
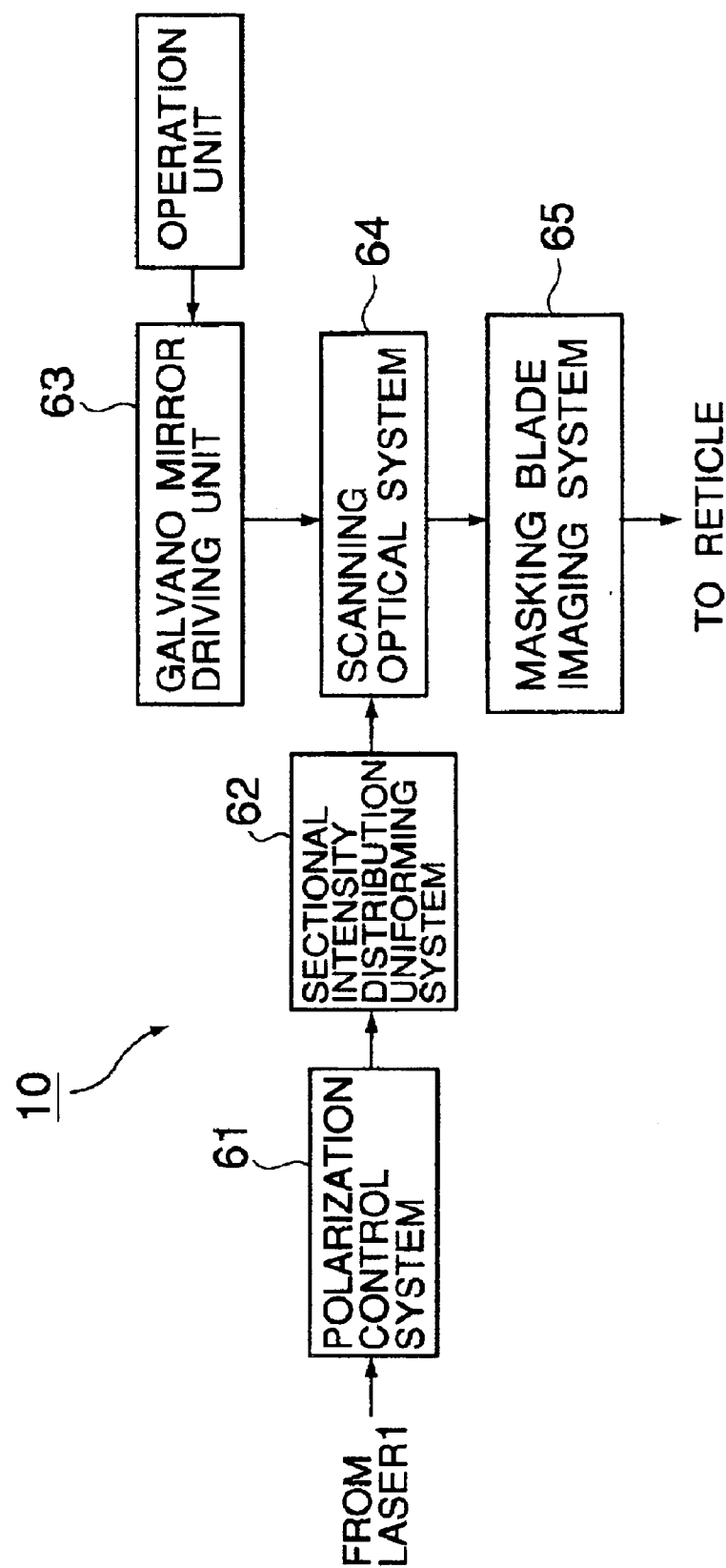
FIG. 5 is a block diagram for explaining the structure of an illumination optical system shown in FIG. 3.

FIG. 5 is a block diagram for explaining the structure of the illumination optical system 10 shown in FIG. 3. In FIG. 5, laser light emitted from the continuous emission excimer laser 1 (FIG. 3) is divided by a polarization control system 61 into at least two light beams. If it is bisected, for example, the laser beam may be divided into two light beams having mutually orthogonal polarization directions. A sectional intensity distribution uniforming system 62 uses the light beams thus divided, to make the sectional intensity distribution of the laser light uniform. Both the polarization control system and the sectional intensity distribution uniforming system may be of a known type. Usually, the sectional intensity distribution uniforming system may include at least one of a combination of a fly's eye lens and a condensing optical system, and an optical pipe (kaleidoscope).

Laser light from the sectional intensity distribution uniforming system 62 is focused by a scanning optical system 64 upon a pupil plane of the illumination optical system 10. Then, one or two galvano mirrors of the scanning optical system 64, provided for two-dimensional scanning, are actuated and rotated by a driving unit 63, by which a laser light spot formed on the pupil plane of the illumination optical system 10 is scanningly moved. As a result of this, a secondary light source (effective light source) having a predetermined shape and size is produced on the pupil plane. The thus produced secondary light source may have a circular shape, a ring-like zone shape having a finite width, or a quadrupole shape, for example. The shape may be chosen automatically or manually in accordance with the type or size of the pattern of the reticle. The laser light from the scanning optical system 64 goes through a masking blade imaging system 65, and it impinges on the reticle (not shown). Consequently, the reticle is illuminated with slit-like light having a rectangular or arcuate sectional shape as described above.

The masking blade imaging system 65 serves to form, upon the reticle, an image of a masking blade which is disposed before or after the above-described pupil plane and held optically conjugate with the reticle, such that it determines the shape of the rectangular or arcuate slit.

Also, the light reflecting position of one or two galvano mirrors provided for the two-dimensional scan and the position of the circuit pattern of the reticle are placed in an optically conjugate relation. Based on these relationships, the light beams produced successively with rotation of the galvano mirror or mirrors can be superposedly projected on the same region on the reticle.

The pupil plane of the illumination optical system 2 is disposed in an optically conjugate relation with the pupil plane (aperture stop) of the projection optical system 3. There is no fly's a eye lens or optical pipe between them. As a result, the light intensity distribution at the pupil plane of the illumination optical system is substantially directly projected on the pupil plane of the projection optical system 3.

Here, if the scan speed of the reticle or wafer is V (mm/sec), the width of the illumination light (slit) on the reticle is W (mm), and the time necessary for drawing (producing) a secondary light source on the pupil plane once is T (sec), the galvano mirror driving unit 63 operates to scanningly move the laser light spot so as to satisfy a relation W/V=nT, where n is an integer. As a result of this, the whole shot region on the wafer can be exposed on the basis of the effective light source of the same shape, such that uniform exposure is assured.

Figure 6:
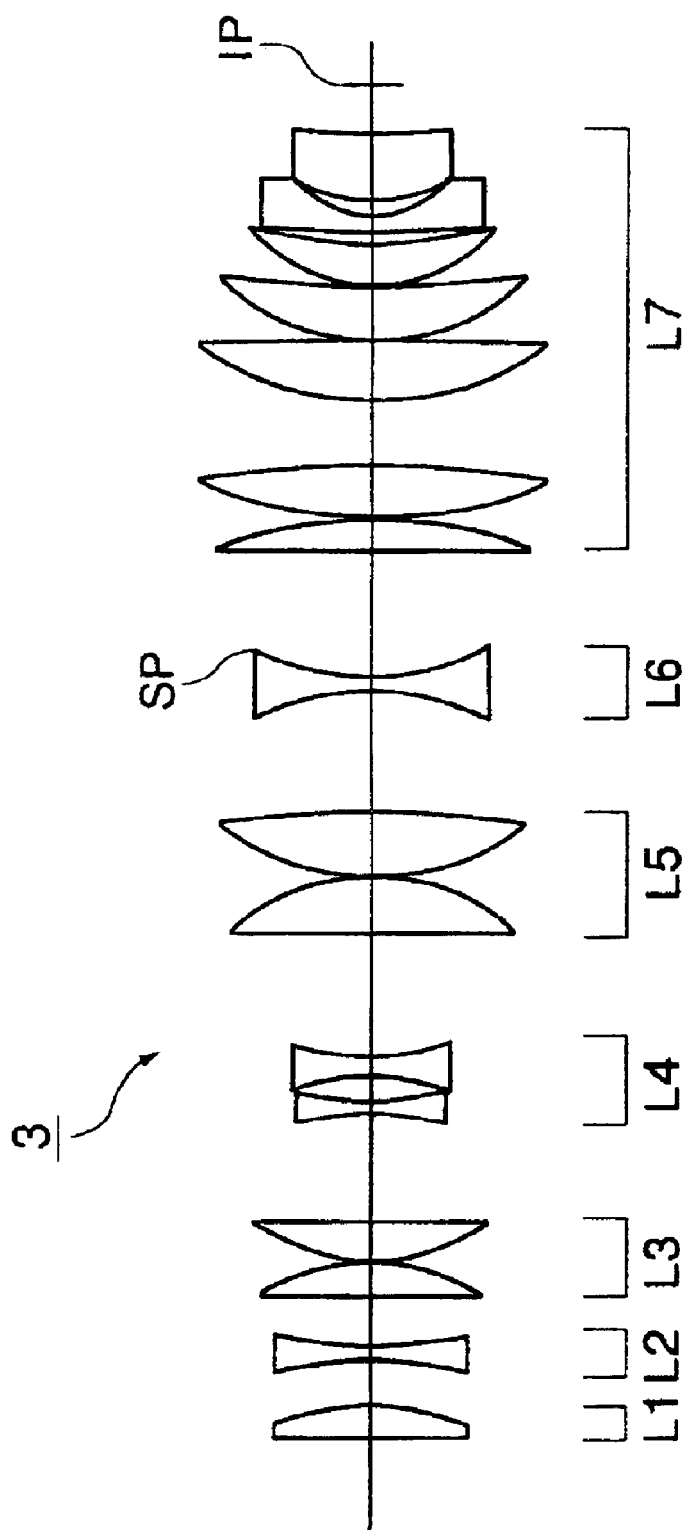
FIG. 6 is a sectional view, showing an example of a lens structure of the projection optical system of FIG. 3.
Figure 7:
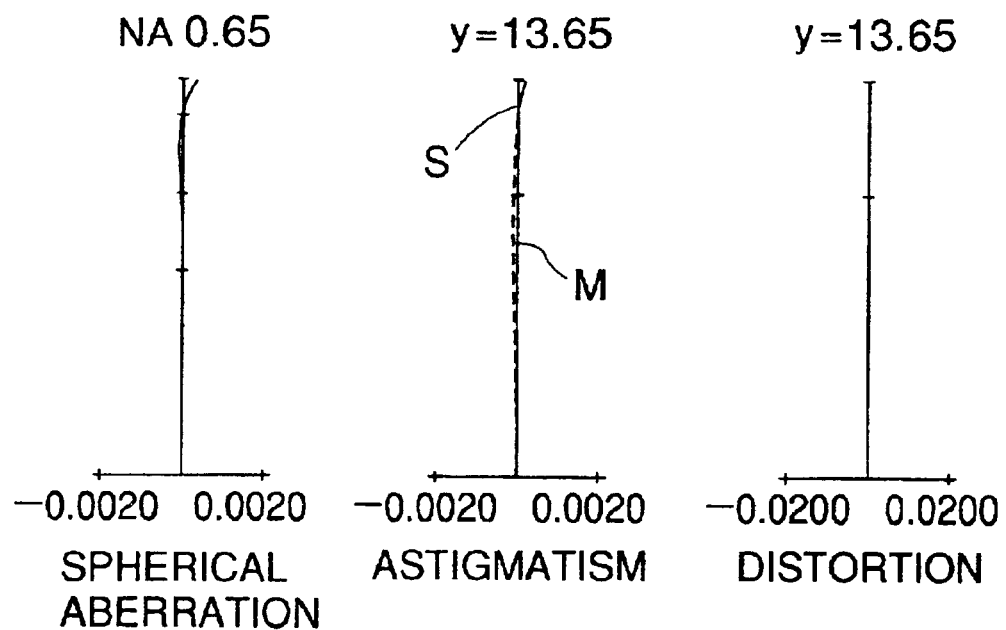
FIG. 7 illustrates aberrations of the projection optical system of FIG. 6.
Figure 7:
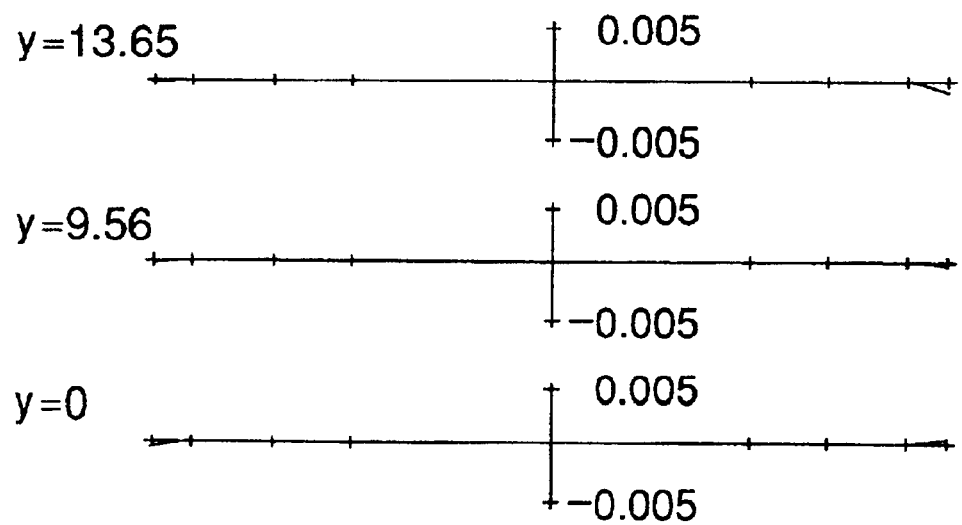

FIG. 6 shows an example of a lens structure of a projection optical system 3, and FIG. 7 illustrates aberrations of the projection optical system 3 of FIG. 6.

In the projection optical system 3 of FIG. 6, all the lens elements thereof are made of synthetic quartz (SiO2). It has a projection magnification of 1/4. The image side numerical aperture is NA=0.65, and the object-to-image distance (distance from reticle R to wafer W) is L=1000 mm. The design wavelength is 193 nm and, as regards the field range, the diameter of the exposure region upon the wafer is 27.3 mm. Further, the projection optical system is substantially telecentric, both on the object side (reticle side) and the image plane side (wafer side).

Table 1 below shows the lens data of the projection optical system 3 of FIG. 6.

TABLE 1

| i | ri | di | ni | Obj – distance = 64.400 |
|---|---|---|---|---|
| 1 | 0.000 | 21.483 | 1.56020 | |
| 2 | −234.177 | 32.837 | | |
| 3 | −217.725 | 11.000 | 1.56020 | |
| 4 | 417.996 | 33.850 | | |
| 5 | 0.000 | 22.468 | 1.56020 | |
| 6 | −187.357 | 0.700 | | |
| 7 | 146.365 | 26.864 | 1.56020 | |
| 8 | 2044.065 | 74.989 | | |
| 9 | −217.939 | 11.000 | 1.56020 | |
| 10 | 218.942 | 19.185 | | |
| 11 | −111.200 | 11.000 | 1.56020 | |
| 12 | 162.388 | 83.304 | | |
| 13 | 4095.070 | 42.510 | 1.56020 | |
| 14 | −165.000 | 0.700 | | |
| 15 | 203.723 | 45.798 | 1.56020 | |
| 16 | −760.044 | 82.340 | | |
| 17 | −193.459 | 11.000 | 1.56020 | |
| 18 | 188.694 | 20.034 | | |
| 19 | 0.0 (stop) | 68.080 | | |
| 20 | −2876.458 | 19.965 | 1.56020 | |
| 21 | −387.880 | 0.700 | | |
| 22 | 366.325 | 37.399 | 1.56020 | |
| 23 | −613.820 | 45.002 | | |
| 24 | 243.386 | 40.478 | 1.56020 | |
| 25 | −4311.737 | 0.700 | | |
| 26 | 181.915 | 35.797 | 1.56020 | |
| 27 | 881.126 | 0.700 | | |
| 25 | 119.183 | 27.705 | 1.56020 | |
| 29 | 256.810 | 9.045 | | |
| 30 | 770.652 | 11.000 | 1.56020 | |
| 31 | 80.000 | 10.112 | | |
| 32 | 122.097 | 47.000 | 1.56020 | |
| 33 | 275.295 | | | |

| | | | aspherical surfaces | | | | |
|---|---|---|---|---|---|---|---|
| i | K | A | B | C | D | E | F | G |
| 2 | 0.000000e+000 | −1.114212e−007 | 1.060175e−011 | −7.279118e−016 | 4.276504e−020 | −7.962637e−025 | 0.000000e+000 | 0.000000e+000 |
| 3 | 0.000000e+000 | −7.330288e−008 | 1.877977e−011 | −1.654304e−015 | 1.154005e−019 | −3.636200e−024 | 0.000000e+000 | 0.000000e+000 |
| 7 | 0.000000e+000 | 1.794366e−008 | −1.746620e−012 | 2.819556e−016 | −1.250557e−020 | 4.866995e−025 | 0.000000e+000 | 0.000000e+000 |
| 11 | 0.000000e+000 | −1.072701e−007 | −1.342596e−012 | 7.030022e−016 | 5.449568e−020 | 5.143056e−023 | 0.000000e+000 | 0.000000e+000 |
| 17 | 0.000000e+000 | −1.232061e−008 | 1.881693e−012 | 2.948112e−017 | −2.584618e−021 | 1.229520e−026 | 0.000000e+000 | 0.000000e+000 |
| 23 | 0.000000e+000 | 5.143208e−009 | 1.895658e−013 | −2.954221e−018 | 5.204719e−023 | −5.427645e−028 | 0.000000e+000 | 0.000000e+000 |
| 32 | 0.000000e+000 | 2.598613e−008 | 5.141410e−012 | −1.743487e−016 | 4.963194e−020 | −1.947370e−023 | 0.000000e+000 | 0.000000e+000 |

In Table 1, ri is the curvature radius of the i-th surface in an order from the object side, di is the lens thickness of the i-th lens or the size of the i-th air spacing, in an order from the object side, and ni is the refractive index of the glass of the i-th lens in an order from the object side.

Here, an aspherical shape is given by equation (1) below:

$$X = \frac{H^2/h}{1 + (1 - (Hk) \cdot (H/h)^2)^{\frac{1}{2}}} + A \cdot H^4 + B \cdot H^6 + C \cdot H^8 + D \cdot H^{10} + E \cdot H^{12} + F \cdot H^{14} + G \cdot H^{16} + \ldots \quad (1)$$

wherein X is the amount of displacement from the lens vertex in the optical axis direction, H is the distance from the optical axis, ri is the curvature radius, k is the conical constant, and A–G are aspherical coefficients.

The refractive index of quartz with respect to the exposure wavelength of 193 nm is 1.56020. Also, the local curvature power PH of an aspherical surface is given by equation (2)

below, while taking the aforementioned aspherical surface equation (1) as the function of X(H).

$$PH = \frac{N' - N}{\rho} \text{ where} \qquad (2)$$

$$\rho = \frac{(1 + X'^2)^{\frac{3}{2}}}{X''}$$

wherein N and N' are the refractive indices of mediums before and after the refraction surface.

The projection optical system 3 of FIG. 6 comprises, in an order from the object side (reticle side), a first lens group L1 having a positive refractive power, a second lens group L2 having a negative refractive power, a third lens group L3 having a positive refractive power, a fourth lens group L4 having a negative refractive power, a fifth lens group L5 having a positive refractive power, a sixth lens group L6 having a negative refractive power, and a seventh lens group L7 having a positive refractive power. It uses seven aspherical surfaces as such.

The first lens group L1 comprises a single aspherical-surface positive lens, having a flat-convex shape with its convex surface facing to the image side. The aspherical surface at r2 includes a region in which the local curvature power changes in a positive direction. With this aspherical surface, mainly a positive distortion aberration (distortion) is produced, which is contributable to correction of distortion.

The second lens group L2 comprises a single aspherical surface negative lens, having a biconcave shape. The aspherical surface at r3 includes a region in which the local curvature power changes in a negative direction. Also, with respect to the surface r2 of the lens group L1, it includes a region in which the local curvature power changes in an opposite direction.

The third lens group L3 comprises, in an order from the object side, a positive lens of a flat-convex shape and having a convex surface facing to the image side, as well as an aspherical positive lens of an approximately flat-convex shape and having a convex surface facing to the object side.

The fourth lens group L4 comprises, in an order from the object side, a negative lens of a biconcave shape, and an aspherical-surface negative lens, having a biconcave shape. The aspherical surface at r11 includes a region in which the local curvature power changes in a negative direction. Also, with respect to the surface r2 of the lens group L1, it includes a region in which the local curvature power changes in an opposite direction. This aspherical surface is effective mainly to assure well-balanced correction of the image field aberration and coma, for example.

The fifth lens group L5 comprises, in an order from the object side, a positive lens of an approximately flat-convex shape and having a convex surface facing to the image side, as well as a positive lens of a biconvex shape.

The sixth lens group L6 comprises a single aspherical-surface negative lens having a biconcave shape. With this aspherical surface, mainly, spherical aberration and coma to be produced by a strong negative refracting power can be corrected effectively.

The seventh lens group L7 comprises, in an order from the object side, (i) a positive lens of a meniscus shape and having a convex surface facing to the image side, (ii) an aspherical surface positive lens having a biconvex shape, (iii) a positive lens of an approximately flat-convex shape and having a convex surface facing to the object side, (iv) two positive lenses of a meniscus shape and having a convex surface facing to the object side, (v) a negative lens of a meniscus shape and having a concave surface facing to the image side, and (vi) a positive lens of a meniscus shape and having a convex surface facing to the object side. In this seventh lens group L7, the aspherical surface where an axial light flux, which is a light flux emitted from the axis upon the object surface is used at a higher position, serves mainly to correct a negative spherical aberration to be produced by the seventh lens group that has a strong positive refracting power. Also, the aspherical surface used at the convex surface adjacent to the image plane, is contributable mainly to assure well-balanced correction of the coma and distortion.

In accordance with the projection optical system 3 of this embodiment, aspherical surface lenses are introduced at five surfaces, particularly, before the stop. Mainly, this enables well-balanced and effective correction of the distortion, astigmatism and coma, for example. Further, in this projection optical system, a surface which is very influential to abaxial chief rays is formed by an aspherical surface, this being very effective mainly to correct aberrations related to abaxial rays and also being effective to reduce burdens for correction of other aberrations. This assures a good optical performance. Seven aspherical surface lenses are used in this projection optical system, by which an optical system comprising a very small number of lens elements (sixteen in total), is accomplished while satisfying a large numerical aperture NA, on the other hand.

The projection optical system 3 shown in FIG. 6 comprises a monochromatic lens system in which all the lens elements are made of synthetic quartz (SiO2). However, in the projection optical system of FIG. 6, one or two lens elements of the seventh lens group L7, which are closest to the wafer, or a cover glass member (not shown) used therein, may be made of fluorite (CaF2). This improves the durability of the lens system. Thus, in the present invention, those referred to by the by words "a lens system comprising a substantially single glass material" include lens systems such as described above.

Figure 8:
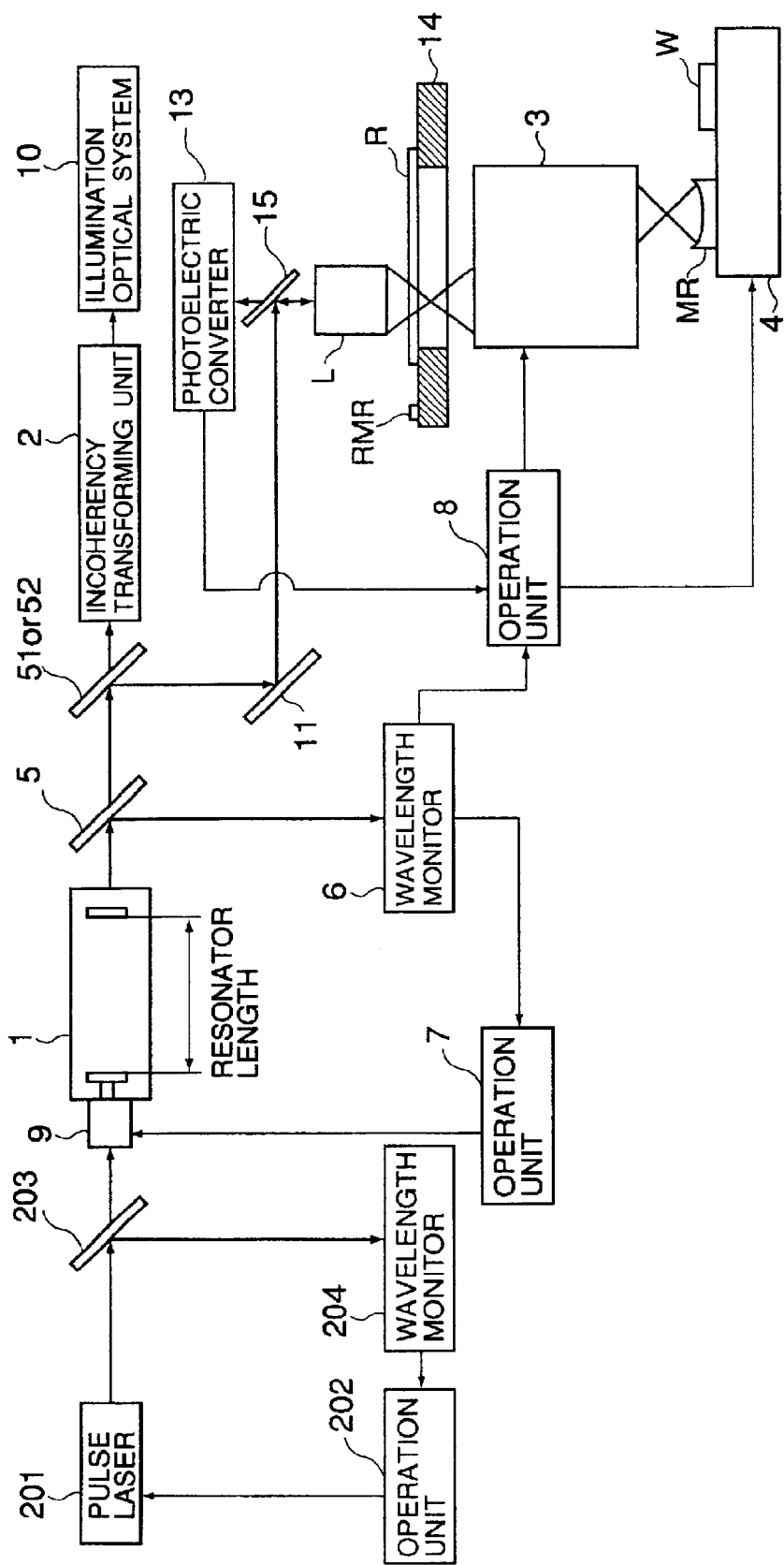
FIG. 8 is a schematic view of a projection exposure apparatus according to a fourth embodiment of the present invention.

FIG. 8 is a schematic view of a projection exposure apparatus according to a fourth embodiment of the present invention. In FIG. 8, those elements corresponding to the components of the projection exposure apparatus of FIG. 3 are denoted by the same reference numerals and characters, and a description thereof is omitted. In the projection exposure apparatus of FIG. 8, the output of the wavelength monitor is applied also to an operation unit 8, in addition to the operation unit 7. The operation unit 8 operates on the basis of any variation in output of the wavelength monitor 6 (that is, variation in wavelength of the laser light), in addition to the output of the photoelectric converter 13, and corrects a change in optical characteristic of the projection optical system 3 such as magnification, focal point position and aberration, for example. The correction of optical characteristics may be made by moving one or plural lenses of the projection optical system 3 or the movable stage 4 in the optical axis direction, or in accordance with any other method known in the art. With the provision of the function for correcting the optical characteristics of the projection optical system 3, such as described above, wavelength stabilization through the operation unit 7 and the piezoelectric device 9 and the correction of optical characteristics can be performed selectively or, alternatively, both may be done.

The projection exposure apparatus of the embodiment shown in FIG. 8 is provided with a mechanism for injecting pulse light, as produced by a pulse emission ArF excimer laser 201 having a center wavelength 193 nm and a half bandwidth not greater than 1 pm, into the continuous emission excimer laser 1, such that the emission wavelength of the continuous emission excimer laser 1 can be held at the emission wavelength of the pulse light. This procedure is called injection locking.

In continuous emission excimer lasers, in some cases, it takes a substantial time until, after a start of the emission, the center wavelength becomes equal to a design value (usually, the same as the wavelength with respect to which an optical system is designed) or alternatively, in worst cases, the emission wavelength does not come to the design value. If, on the other hand, in accordance with the injection locking method, the pulse emission excimer laser light having a center wavelength the same as the design wavelength thereof and having its bandwidth narrowed to 1 pm or less is injected into a continuous emission excimer laser, the emission wavelength of the continuous emission excimer laser can be held at the design wavelength 193 nm thereof, just from the start of the emission.

A portion of the laser light outputted from the pulse emission excimer laser 201 is reflected by a semi-transmission mirror 203, and it enters a wavelength monitor 204. The wavelength monitor 204 serves to detect the wavelength of the pulse laser light, and it applies the detection result to an operation unit 202. On the basis of the output of the wavelength monitor 204, the operation unit 202 detects the amount of any deviation of the current center wavelength of the pulse laser light, from the design wavelength. Also, on the basis of the thus detected deviation, the operation unit 202 actuates a band-narrowing element inside the pulse emission excimer laser 201 (for example, it may be a prism, a diffraction grating or an etalon), so as to assure that the center wavelength of the pulse emission excimer laser 201 becomes equal to the design wavelength 193 nm. As a result of this, the pulse laser light whose center wavelength is held at 193 nm can be injected into the continuous emission excimer laser 1. During this injection, a wavelength stabilization mechanism (5, 6, 7, 9) for the continuous emission excimer laser may be operated, such that the center wavelength of the continuous emission excimer laser 1 can be quickly held at the design wavelength 193 nm. After this, the injection locking may be discontinued, unless the continuous emission excimer laser 1 is restarted. Even if the injection locking is discontinued, as long as the wavelength stabilization mechanism (5, 6, 7, 9) is held in operation, the center wavelength of the laser light outputted from the continuous emission excimer laser 1 can be maintained constant. Thus, in the projection optical system 3 which is a monochromatic lens system, any variation in the optical characteristics thereof such as magnification, focal point position or aberration, for example, due to changes in wavelength of the laser light from the continuous emission excimer laser 1, can be avoided. As a result, a circuit pattern of a reticle can be projected on a wafer W very accurately.

In accordance with this embodiment of the present invention, a projection exposure apparatus by which a pattern image of a resolution not broader than 0.09 micron is attainable, is accomplished.

In this case, the excimer laser 1 may be a continuous emission F2 excimer laer having a center wavelength of 157 nm, and a half bandwidth of 0.1 pm or less, preferably, not greater than 0.08 pm.

In accordance with the embodiments of the present invention as described above, bulkiness of an exposure apparatus, which otherwise might result from introduction of an interferometer into the exposure apparatus, can be avoided.

Next, referring to FIGS. 9 and 10, an embodiment of a device manufacturing method which uses a projection exposure apparatus such as described above, will be explained.

Figure 9:
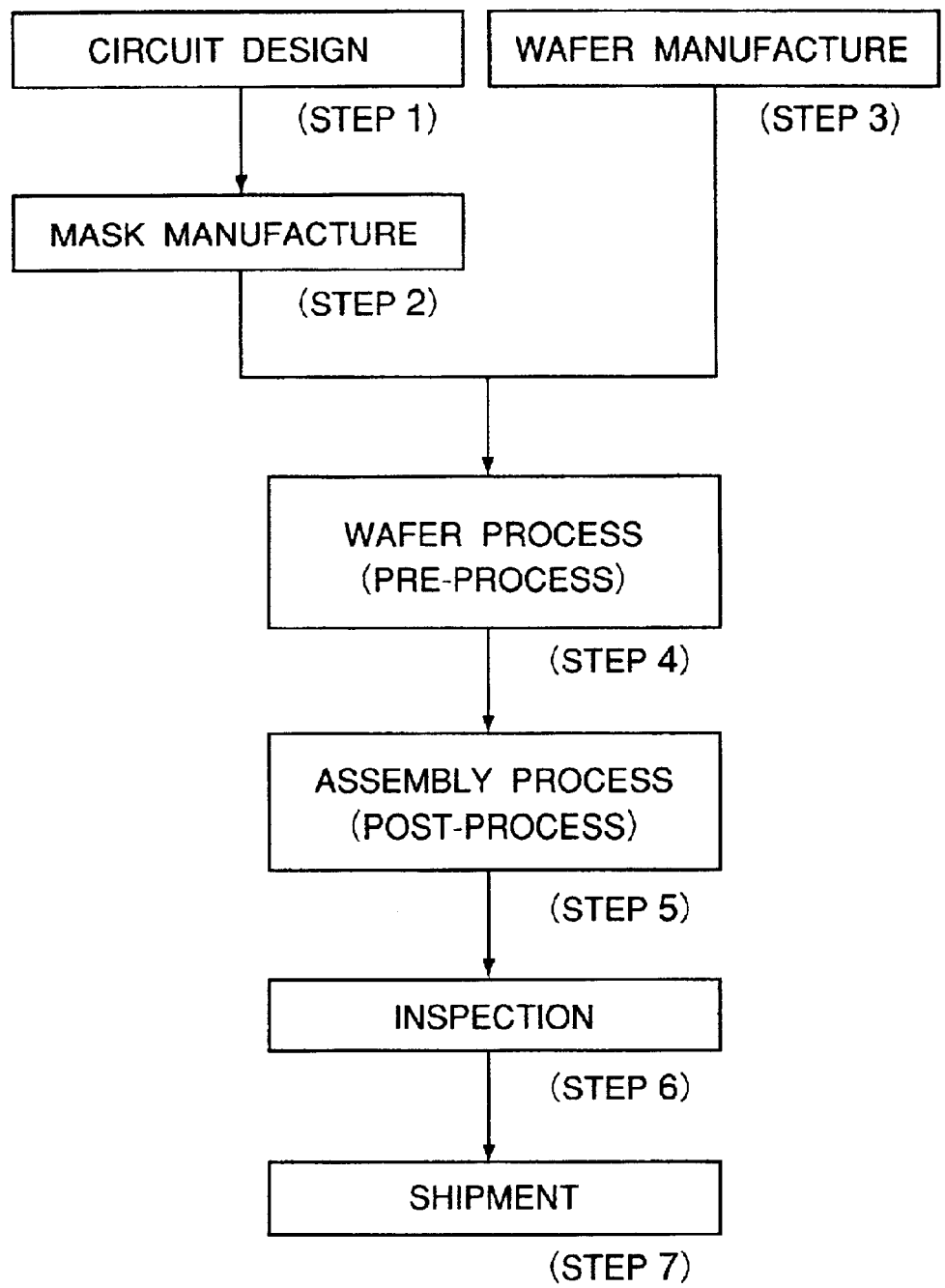
FIG. 9 is a flow chart of microdevice manufacturing processes.

FIG. 9 is a flow chart for explaining the procedure of manufacturing various microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 5 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

Figure 10:
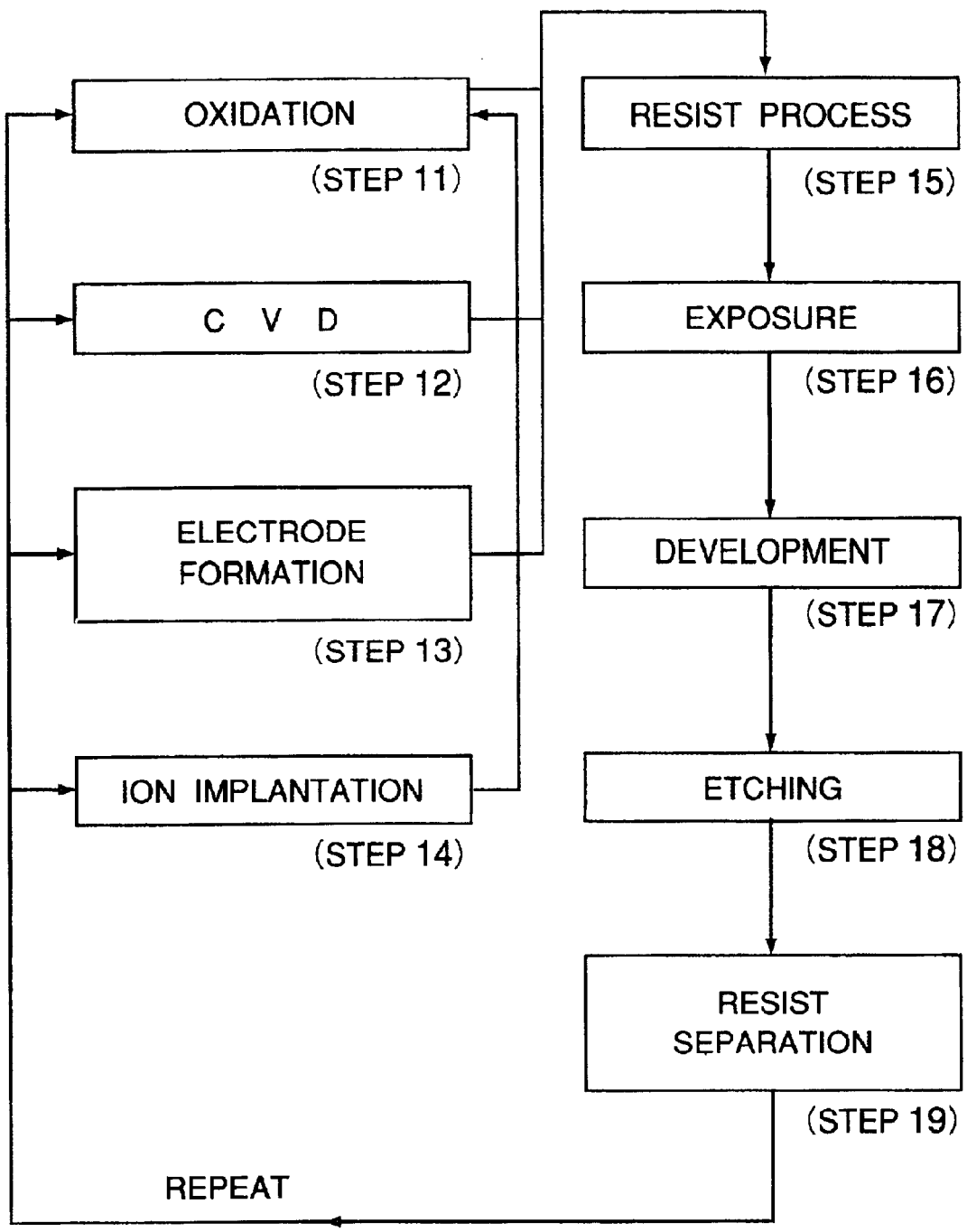
FIG. 10 is a flow chart for explaining details of a wafer process in the procedure shown in FIG. 9.

FIG. 10 is a flow chart for explaining details of the wafer process. Step 11 is an oxidation process for oxidizing the surface of a wafer. Step 12 is a CVD process for forming an insulating film on the wafer surface Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
   an illumination optical system for illuminating a pattern of a reticle with laser light outputted from a continuous emission laser;
   a projection optical system for projecting the illuminated pattern onto a subject to be exposed;
   an interferometer, of a Fizeau type, being operable while using laser light outputted from said continuous emission laser; and
   a stabilization mechanism for stabilizing an emission wavelength of said continuous emission laser, by moving a resonance mirror of said continuous emission laser.

2. An apparatus according to claim 1, wherein said interferometer includes a reflection member disposed on a stage for holding the subject.

3. An apparatus according to claim 1, wherein said interferometer is operable to form an interference fringe for measurement of the wavefront aberration of said projection optical system.

4. An apparatus according to claim 1, wherein said continuous emission laser is a continuous emission excimer laser having an emission wavelength of 193 nm or 157 nm.

5. An apparatus according to claim 1, further comprising a semi-transmission mirror, disposed between said continuous emission laser and said illumination optical system, for directing a portion of the laser light outputted from said continuous emission laser to said interferometer.

6. An apparatus according to claim 5, further comprising an optical system operable to transform laser light outputted from said continuous emission laser into incoherent light and also to direct the incoherent light to the reticle, wherein said semi-transmission mirror is disposed between said continuous emission laser and said optical system, and wherein said semi-transmission mirror directs laser light not transformed into coherent light to said interferometer.

7. An apparatus according to claim 1, further comprising an optical path switching mirror for interchanging the path of the laser light outputted from said continuous emission laser, between a light path directed to said illumination optical system and a light path directed to said interferometer.

8. An apparatus according to claim 7, further comprising an optical system operable to transform laser light outputted from said continuous emission laser into incoherent light and also to direct the incoherent light to the reticle, wherein said optical path switching mirror is disposed between said continuous emission laser and said optical system, and said optical path switching mirror directs laser light not transformed into coherent light to said interferometer.

9. An apparatus according to claim 1, further comprising a photoelectric converter for taking an image of an interference fringe produced by said interferometer, and an operation unit for analyzing an output of said photoelectric converter to control said projection optical system.

10. An apparatus according to claim 1, further comprising a pulse emission laser for injecting laser light of a predetermined wavelength into said continuous emission laser.

11. A device manufacturing method, comprising the steps of:
 exposing a wafer to a pattern by use of an exposure apparatus as recited in claim 1; and
 developing the exposed wafer.

12. An apparatus according to claim 1, wherein said interferometer measures characteristics of said exposure apparatus.

13. An apparatus according to claim 1, wherein said interferometer measures wavefront aberration of said projection optical system.

* * * * *

UNITED STATES PATENT AND TRADEMARK OFFICE
CERTIFICATE OF CORRECTION

PATENT NO. : 6,774,982 B2
DATED : August 10, 2004
INVENTOR(S) : Chidane Ouchi

It is certified that error appears in the above-identified patent and that said Letters Patent is hereby corrected as shown below:

Column 6,
Line 66, "fly's a eye" should read -- fly's eye --.

Column 7,
Line 26, "-387.880" should read -- -387.830 --.
Line 32, "25" should read -- 28 --.

Column 12,
Line 23, "surface" should read -- surface. --.

Signed and Sealed this

Seventh Day of December, 2004

JON W. DUDAS
*Director of the United States Patent and Trademark Office*